United States Patent
Lin et al.

(10) Patent No.: US 10,262,944 B2
(45) Date of Patent: Apr. 16, 2019

(54) SEMICONDUCTOR DEVICE HAVING INTERCONNECT LAYER THAT INCLUDES DIELECTRIC SEGMENTS INTERLEAVED WITH METAL COMPONENTS

(71) Applicant: Taiwan Semiconductor Manufacturing Co., Ltd., Hsin-Chu (TW)

(72) Inventors: Chun-Chieh Lin, Taichung (TW); Hung-Wen Su, Jhubei (TW); Ming-Hsing Tsai, Chu-Pei (TW); Syun-Ming Jang, Hsin-Chu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 15/370,016

(22) Filed: Dec. 6, 2016

(65) Prior Publication Data
US 2017/0084485 A1   Mar. 23, 2017

Related U.S. Application Data

(60) Continuation of application No. 14/706,311, filed on May 7, 2015, now Pat. No. 9,520,362, which is a (Continued)

(51) Int. Cl.
| | |
|---|---|
| *H01L 23/522* | (2006.01) |
| *H01L 23/528* | (2006.01) |
| *H01L 23/532* | (2006.01) |
| *H01L 29/51* | (2006.01) |
| *H01L 21/768* | (2006.01) |

(52) U.S. Cl.
CPC .... *H01L 23/53295* (2013.01); *H01L 21/7681* (2013.01); *H01L 21/76807* (2013.01);
(Continued)

(58) Field of Classification Search
CPC .......... H01L 23/53238; H01L 23/5226; H01L 23/528; H01L 23/53295; H01L 23/5329; H01L 29/511; H01L 2221/1031; H01L 2924/0002; H01L 21/76877; H01L 21/76886; H01L 21/76807; H01L 21/76834; H01L 21/7681; H01L 21/76831; H01L 21/76846
See application file for complete search history.

(56) References Cited

U.S. PATENT DOCUMENTS

| | | | |
|---|---|---|---|
| 6,153,521 A | 11/2000 | Cheung et al. |
| 6,184,138 B1 | 2/2001 | Ho et al. |

(Continued)

*Primary Examiner* — Galina G Yushina
(74) *Attorney, Agent, or Firm* — Haynes and Boone, LLP

(57) ABSTRACT

An interconnect layer is disposed over a substrate. The interconnect layer includes a plurality of dielectric segments interleaved with a plurality of metal components. A plurality of vias is disposed below, and electrically coupled to, a first group of the metal components. A plurality of dielectric components is disposed underneath a second group of the metal components. The dielectric components interleave with the vias. A conductive liner is disposed below a bottom surface and on sidewalk of the vias. A dielectric barrier layer is disposed below a bottom surface and on sidewalls of the dielectric segments. The dielectric barrier layer and the dielectric segments have different material compositions.

20 Claims, 10 Drawing Sheets

Related U.S. Application Data division of application No. 13/161,701, filed on Jun. 16, 2011, now Pat. No. 9,029,260.

(52) U.S. Cl.
CPC .. *H01L 21/76831* (2013.01); *H01L 21/76834* (2013.01); *H01L 21/76846* (2013.01); *H01L 21/76877* (2013.01); *H01L 21/76885* (2013.01); *H01L 23/528* (2013.01); *H01L 23/5226* (2013.01); *H01L 23/5329* (2013.01); *H01L 23/53238* (2013.01); *H01L 29/511* (2013.01); *H01L 2221/1031* (2013.01); *H01L 2924/0002* (2013.01)

(56) References Cited

U.S. PATENT DOCUMENTS

| | | | |
|---|---|---|---|
| 6,265,303 B1 * | 7/2001 | Lu | H01L 21/02126 257/E21.241 |
| 6,265,779 B1 * | 7/2001 | Grill | H01L 21/3127 257/759 |
| 6,331,481 B1 * | 12/2001 | Stamper | H01L 21/31053 257/E21.242 |
| 6,355,563 B1 | 3/2002 | Cha et al. | |
| 6,495,200 B1 | 12/2002 | Chan et al. | |
| 6,583,043 B2 * | 6/2003 | Shroff | H01L 21/76832 257/E21.576 |
| 6,780,756 B1 * | 8/2004 | Farber | H01L 21/76829 257/E21.576 |
| 6,818,546 B2 * | 11/2004 | Saito | H01L 21/28518 257/E21.576 |
| 6,878,615 B2 | 4/2005 | Tsai et al. | |
| 7,101,790 B2 | 9/2006 | Lee et al. | |
| 7,387,961 B2 | 6/2008 | Tseng et al. | |
| 7,629,690 B2 | 12/2009 | Wu et al. | |
| 2002/0149110 A1 | 10/2002 | Ahn et al. | |
| 2004/0087101 A1 | 5/2004 | Balakumar et al. | |
| 2008/0111239 A1 * | 5/2008 | Yang | H01L 21/76847 257/751 |
| 2010/0164111 A1 | 7/2010 | Yang et al. | |

* cited by examiner

SEMICONDUCTOR DEVICE HAVING INTERCONNECT LAYER THAT INCLUDES DIELECTRIC SEGMENTS INTERLEAVED WITH METAL COMPONENTS

PRIORITY DATA

The present application is a continuation of U.S. patent application Ser. No. 14/706,311, filed on May 7, 2015, now U.S. Pat. No. 9,520,362 issued on Dec. 13, 2016, which is a divisional application of U.S. patent application Ser. No. 13/161,701, filed on Jun. 16, 2011, now U.S. Pat. No. 9,029,260 issued May 12, 2015, the disclosure of each of which is hereby incorporated by reference in their respective entireties.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased.

A dual damascene process has been developed to form the increasingly interconnect features such as vias and metal lines. The dual damascene process involves forming gaps or openings. Traditional dual damascene processes use a seed layer plus a copper plating process to fill the gaps. However, this approach may run into problems as semiconductor device sizes continue to shrink. For example, in a 20-nanometer (nm) fabrication process, the gaps may become too narrow and thus may not be properly filled by conventional dual damascene processes. The top portion of the gap may be blocked, which may create a void underneath. Consequently, semiconductor device performance is degraded.

Therefore, while existing dual damascene processes have been generally adequate for their intended purposes, they are not entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
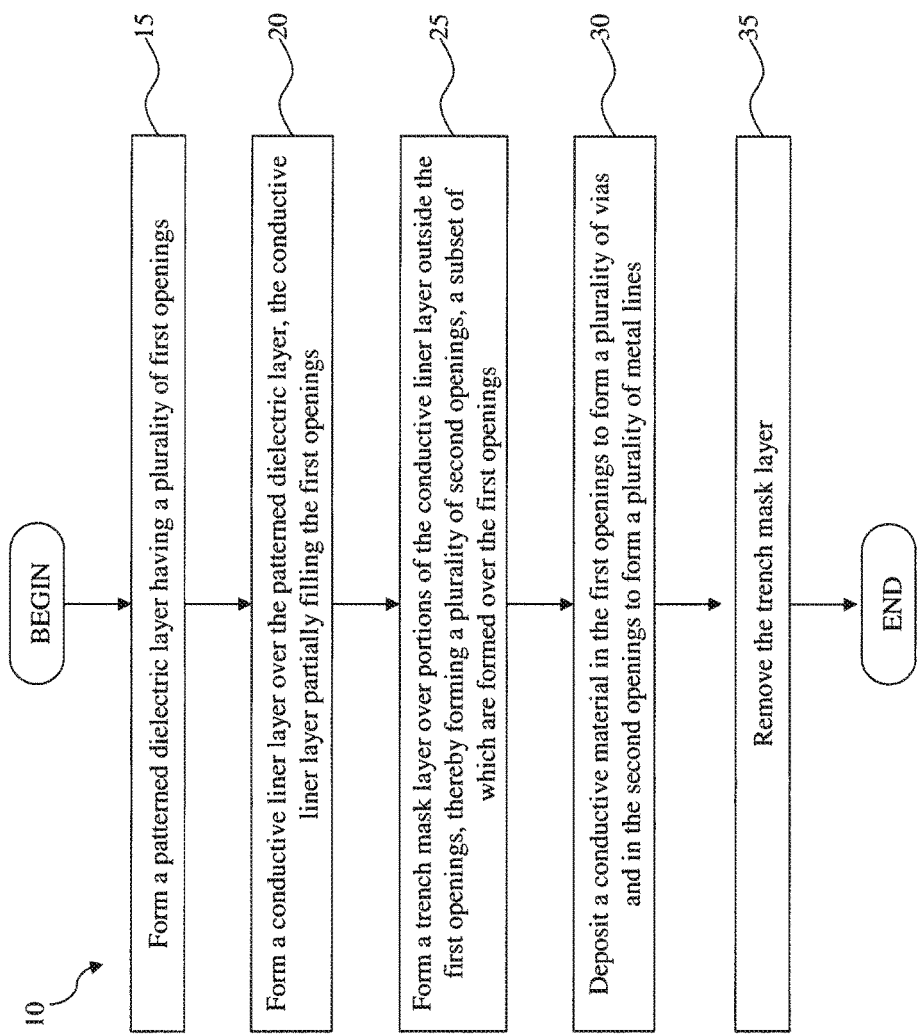
FIG. 1 is a flowchart illustrating a method for fabricating a semiconductor device to reduce a critical dimension according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 10 for improving the gap filling performance of a dual damascene process. FIGS. 2-10 are cross-sectional views that illustrate an embodiment of a semiconductor device during various fabrication stages. The semiconductor device may be an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2-10 have been simplified for a better understanding of the inventive concepts of the present disclosure. Accordingly, it should be noted that additional processes may be provided before, during, and after the method 10 of FIG. 1, and that some other processes may only be briefly described herein.

Referring to FIG. 1, the method 10 begins with block 15 in which a patterned dielectric layer having a plurality of first openings is formed. The method 10 continues with block 20 in which a conductive liner layer is formed over the patterned dielectric layer. The conductive liner layer partially fills the first openings. The method 10 continues with block 25 in which a trench mask layer is formed over portions of the conductive liner layer outside the first openings, thereby forming a plurality of second openings, a subset of which are formed over the first openings. The method 10 continues with block 30 in which a conductive material is deposited in the first openings to form a plurality of vias and in the second openings to form a plurality of metal lines. The method 10 continues with block 35 in which the trench mask layer is removed. It is understood that additional processes may be performed before, during, and after the blocks 15-35 to complete the fabrication of the semiconductor device, but these processes are not illustrated herein for the sake of simplicity.

Figure 2:
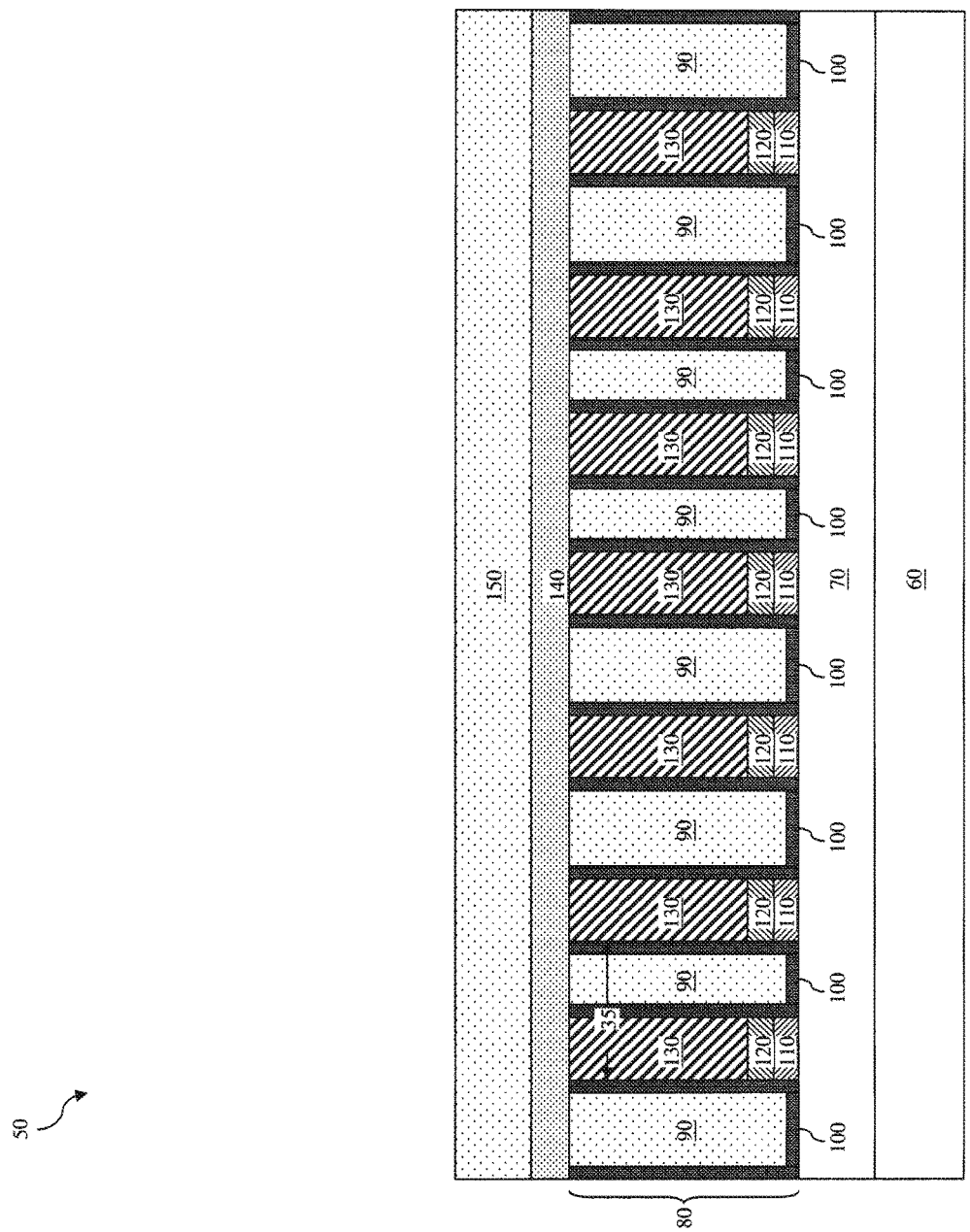
FIGS. 2-10 are diagrammatic cross-section side views of a semiconductor device at various stages of fabrication according to the method of FIG. 1.

FIGS. 2-10 are diagrammatic fragmentary cross-sectional side views of a portion of a semiconductor device 50 at various stages of fabrication. Referring to FIG. 2, the semiconductor device 50 includes a substrate 60. The substrate 60 may be a portion of a semiconductor wafer. For example, the substrate 60 may include silicon. The substrate 60 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In one embodiment, the substrate 60 includes various doped features for various microelectronic components, such as a complementary metal-oxide-semiconductor field-effect transistor (CMOSFET), imaging sensor, memory cell, and/or capacitive element.

An interlayer dielectric (ILD) layer 70 is formed on the substrate 60. The ILD layer 70 includes a dielectric material, for example Undoped Silicate Glass (USG) or Phosphosilicate Glass (PSG).

An interconnect layer 80 is formed over the ILD layer 70. The interconnect layer 80 may also be referred to as a metal layer. In an embodiment, the interconnect layer 80 is a Metal-1 (M1) layer. The interconnect layer 80 includes a dielectric layer 90. The dielectric layer 90 includes a low-k material in an embodiment, for example, a compound made of a subset of the following elements: silicon (Si), oxygen (O), carbon (C), and hydrogen (H). For example, the compound may be silicon oxide or silicon carbide. In an embodiment, the dielectric layer 90 has a thickness that is less than about 1000 Angstroms.

In the illustrated embodiment, the dielectric layer 90 includes a plurality of segments. Each segment of the dielectric layer 90 is at least partially surrounded or wrapped around by a dielectric barrier layer 100. In an embodiment, the dielectric barrier layer 100 includes a compound made of a subset of the following elements: Si, O, C, nitrogen (N), and boron (B). For example, the compound may be silicon nitride or silicon carbide. In an embodiment, the dielectric barrier layer 100 has a thickness that is less than about 50 Angstroms. The dielectric barrier layer 100 serves to reduce metal diffusion.

The interconnect layer 80 also includes a conductive barrier layer 110. The conductive barrier layer 110 includes a conductive material. In an embodiment, the conductive material is selected from the group consisting of: tantalum (Ta), tantalum nitride (TaNx), titanium (Ti), titanium nitride (TiNx), manganese oxide (MnOx), and combinations thereof. In an embodiment, the conductive barrier layer 110 has a thickness that is less than about 50 Angstroms. In the illustrated embodiment, the conductive barrier layer 110 includes a plurality of segments. Each segment of the conductive barrier layer 110 is disposed over the ILD layer 70 and in between the segments of the dielectric layer 90.

The interconnect layer 80 also includes a conductive liner layer 120. The conductive liner layer 120 includes a conductive material. In an embodiment, the conductive material is a metal, for example ruthenium (Ru), cobalt (Co), tungsten (W), or combinations thereof. In an embodiment, the conductive liner layer 120 has a thickness that is less than about 50 Angstroms. In the illustrated embodiment, the conductive liner layer 120 includes a plurality of segments. Each segment of the conductive liner layer 120 is disposed on the conductive barrier layer 110 and in between the segments of the dielectric layer 90.

The interconnect layer 80 also includes a conductive layer 130. The conductive layer 130 includes a conductive material. In an embodiment, the conductive material is Cu. In an embodiment, the conductive layer 130 has a thickness that is less than about 900 Angstroms. In the illustrated embodiment, the conductive layer 130 includes a plurality of segments. Each segment of the conductive layer 130 is disposed on a respective segment of the conductive liner layer 120 and in between the segments of the dielectric layer 90. The segments of the conductive layer 130 serve as the metal lines in the interconnect layer 80.

The interconnect layer 80 has a line pitch 135. In an embodiment, the line pitch is less than about 64 nanometers (nm).

An etching-stop layer 140 is formed over the interconnect layer 80. The etching stop layer includes a dielectric material. In an embodiment, the etching-stop layer 140 includes a compound made of a subset of the following elements: Si, O, C, N, and B. For example, the compound may be silicon nitride, silicon carbide, or silicon oxide. The material of the etching-stop layer 140 is chosen such that it has sufficient etching selectivity with the dielectric layer 90. In other words, the etching-stop layer 140 and the dielectric layer 90 include different material compositions. In an embodiment, the etching-stop layer 140 has a thickness that is less than about 300 Angstroms.

A dielectric layer 150 is formed over the etching stop layer 140. The dielectric layer 150 includes a low-k material in an embodiment, for example, a compound made of a subset of the following elements: Si, O, C, and H. For example, the compound may be silicon oxide or silicon carbide. In an embodiment, the dielectric layer 150 has a thickness that is less than about 1000 Angstroms.

Figure 3:
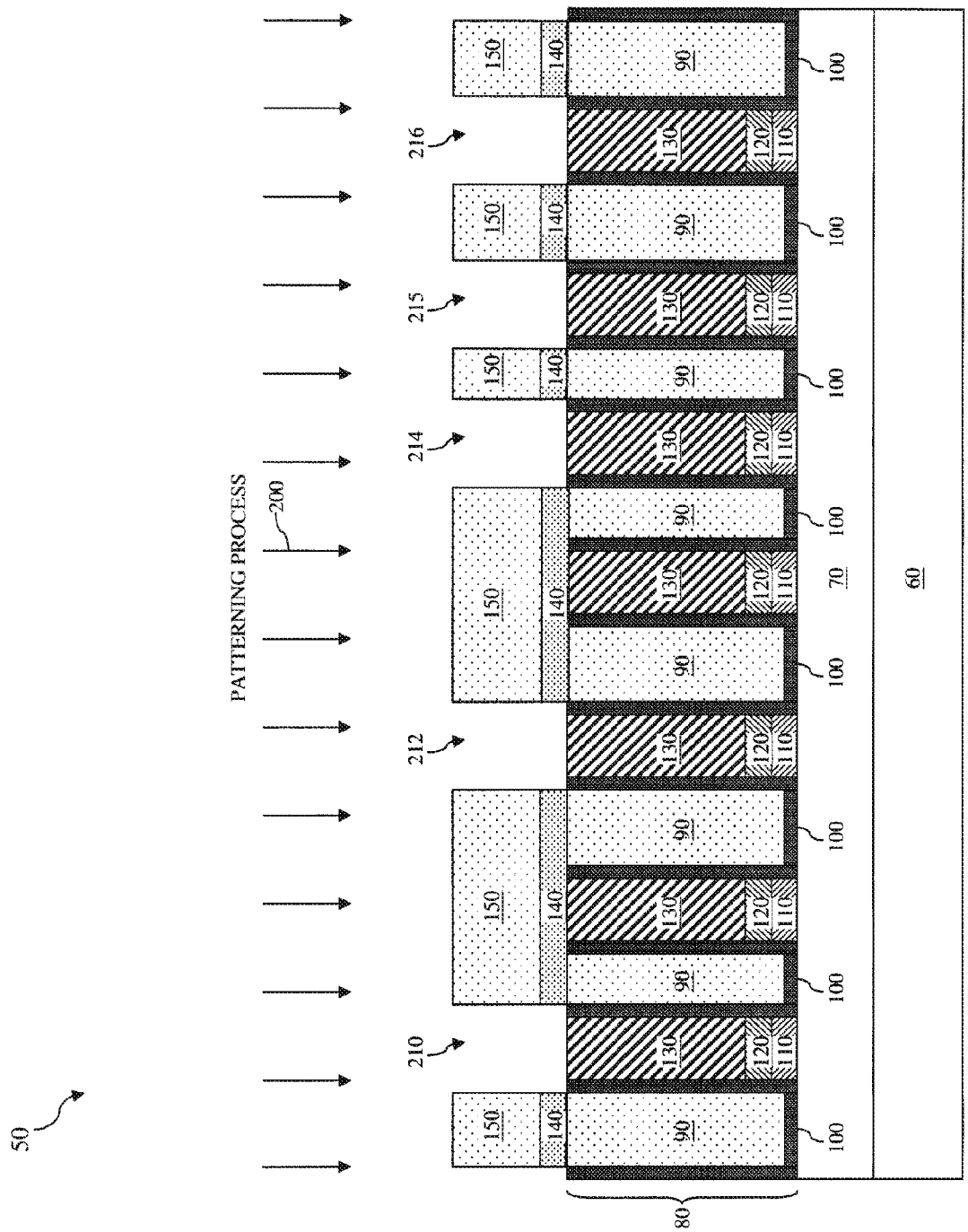

Referring now to FIG. 3, a patterning process 200 is performed on the semiconductor device 50 to form a plurality of openings in the dielectric layer 150. The patterning process 200 may include forming a patterned photoresist layer (not illustrated) using a process such as photolithography, immersion lithography, ion-beam writing, or other suitable processes. For example, the photolithography process may include spin-coating, soft-baking, exposure, post-baking, developing, rinsing, drying, and other suitable processes. The patterning process may also include an etching process in which the patterned photoresist layer may be used as masks to etch the openings in the dielectric layer 140 and layer 150.

For the sake of simplicity, only openings 210-216 are illustrated herein, though it is understood that many other openings are formed. Each of the openings 210-216 is approximately aligned (vertically) with a respective one of the segments of the conductive layer 130 below. In an embodiment, the openings 210-216 may be slightly wider than the segments of the conductive layer 130. In an embodiment, the minimum width of the openings 210-216 is about 32 nm, or about ½ of the line pitch 135.

At this point, it may be said that the dielectric layer 150 constitutes a "via-only structure." In other words, the openings 210-216 are reserved for the formation of vias in a later process, but not for the formation of metal lines. This is different from conventional dual damascene processes, in which a structure is formed that contains trenches reserved for the formation of vias as well as metal lines above the vias.

Figure 4:
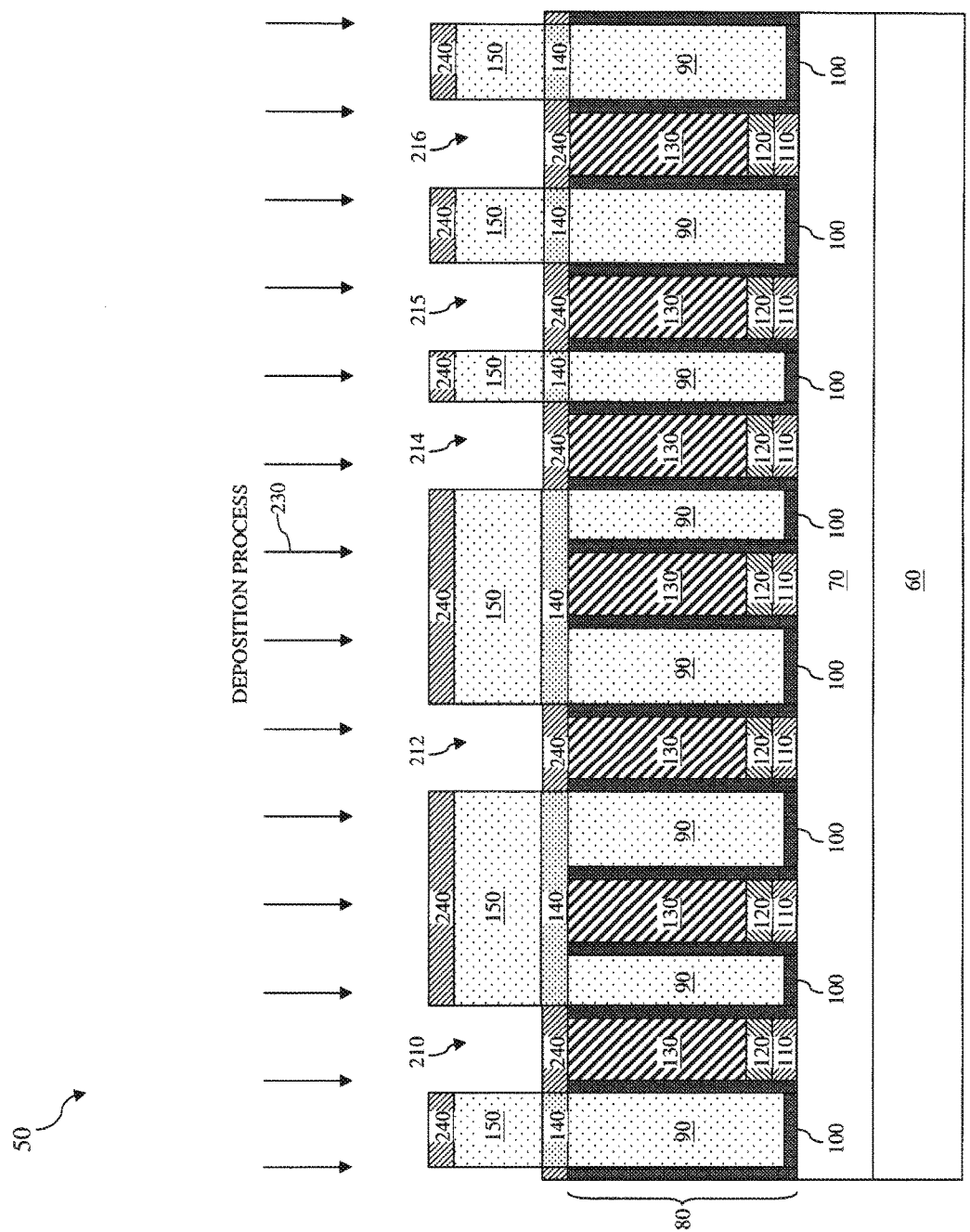

Referring now to FIG. 4, a deposition process 230 is performed to form a conductive harrier layer 240 over the dielectric layer 150 and to partially fill the openings 210-216. The conductive barrier layer 240 is also formed on the sidewalls of the dielectric layer 150 in the openings 210-216. The portions of the conductive barrier layer 240 on these sidewalls are thin, and such are not specifically illustrated herein for the sake of simplicity. In an embodiment, the deposition process 230 includes a chemical vapor deposition (CVD) process. In another embodiment, the deposition 230 includes an atomic layer deposition (ALD) process. The conductive barrier layer 240 includes a conductive material. In an embodiment, the conductive material is selected from the group consisting of: tantalum (Ta), tantalum nitride (TaNx), titanium (Ti), titanium nitride (TiNx), manganese oxide (MnOx), and combinations thereof. In an embodiment, the conductive harrier layer 240 has a thickness that is less than about 50 Angstroms.

Figure 5:
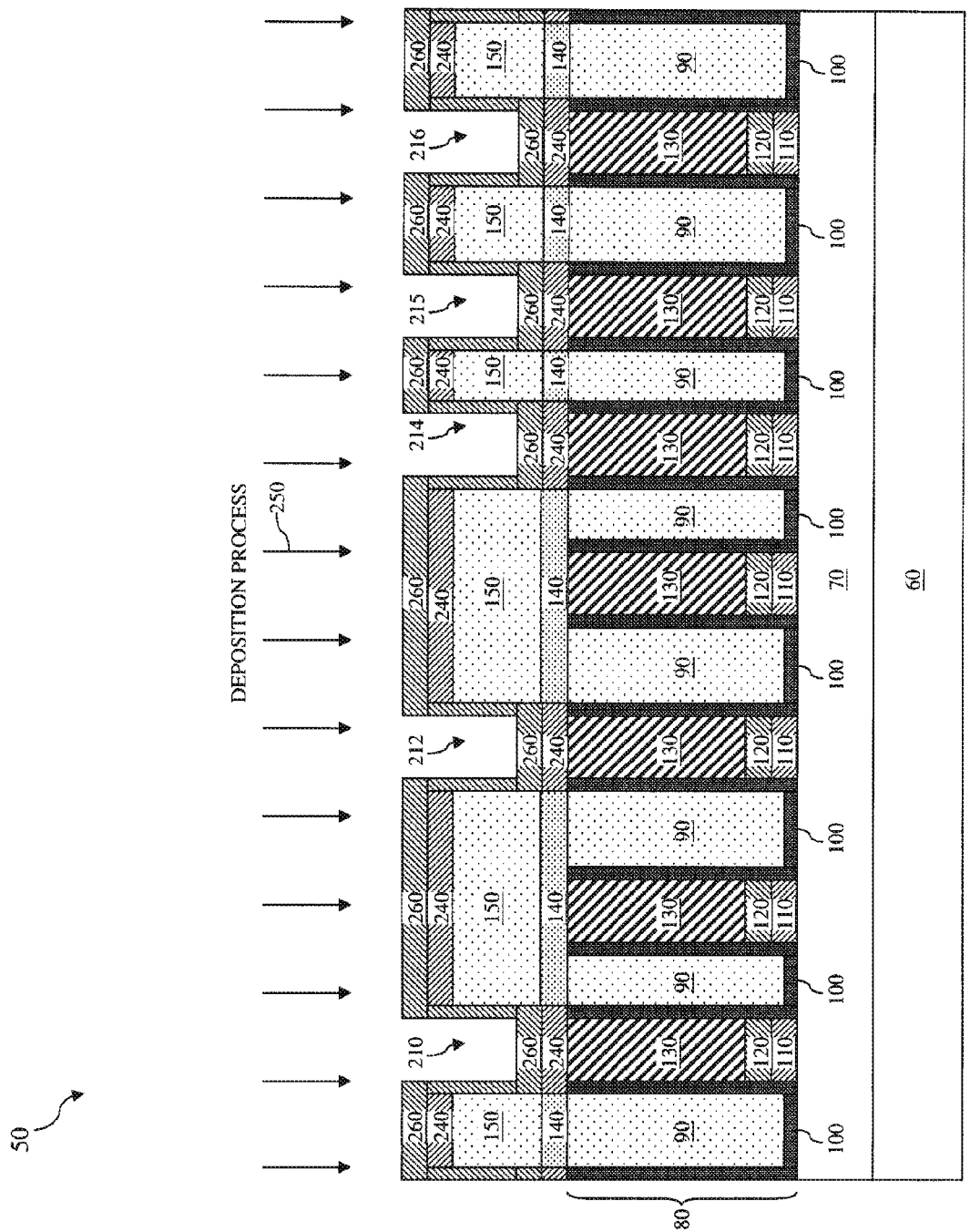

Referring now to FIG. 5, a deposition process 250 is performed to form a conductive liner layer 260 over the conductive barrier layer 240 and to partially fill the openings 210-216. In an embodiment, the deposition process 250 includes a CVD process. In another embodiment, the deposition 250 includes an ALD process. The conductive liner layer 260 includes a conductive material. In an embodiment, the conductive material is a metal, which can be a non-copper material. In an embodiment, the conductive liner layer 260 has a thickness that is less than about 50 Angstroms. The conductive liner layer 260 has a lower conductivity compared to traditional seed layers for electro plating processes. Due to the lower conductivity, it can be used in an electro-less deposition process, which will be discussed below in more detail.

Figure 6:
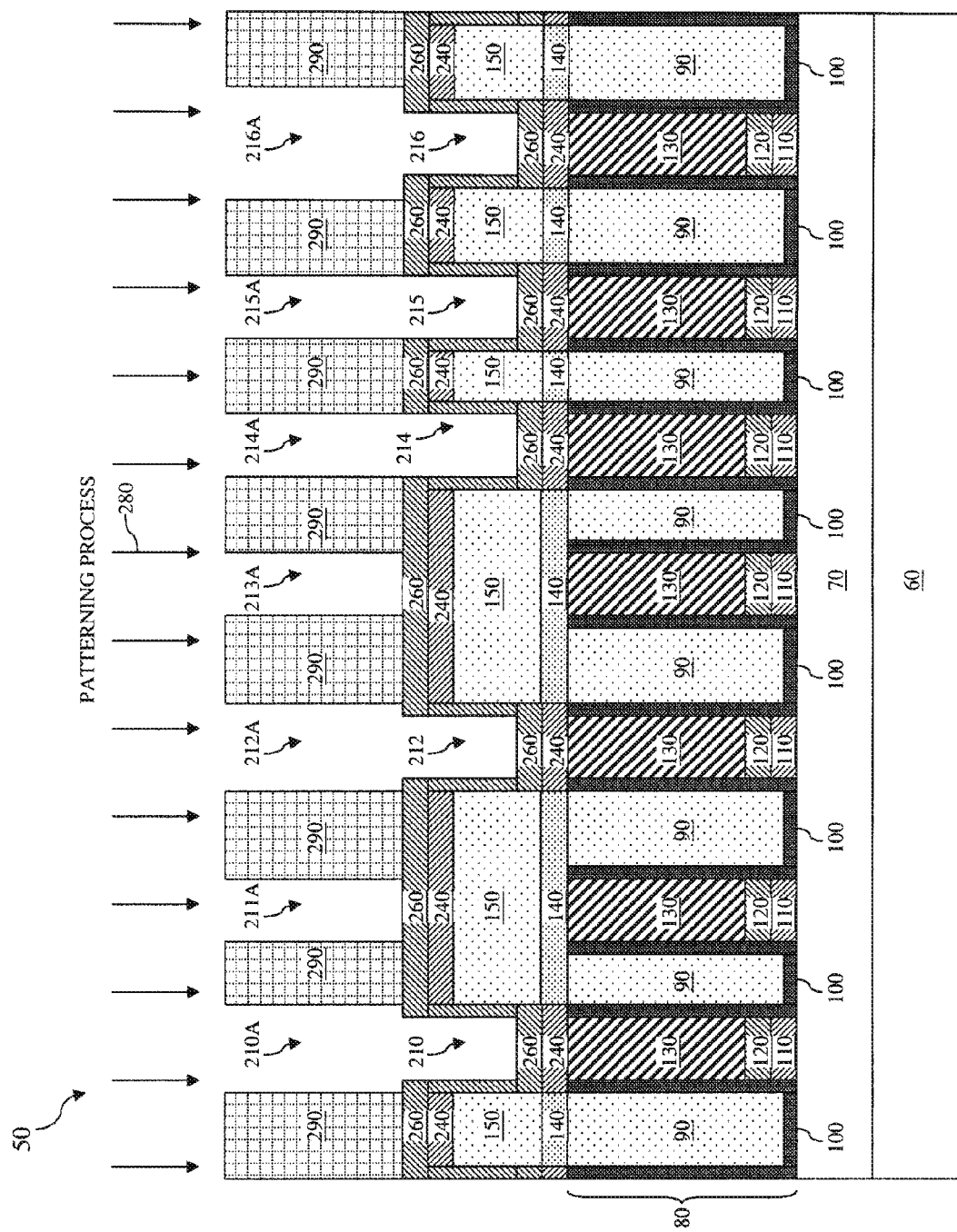

Referring now to FIG. 6, a patterning process 280 is performed on the semiconductor device 50 to form a trench mask layer 290. In one embodiment, the trench mask layer 290 includes a photoresist material, which is patterned using a photolithography process similar to that discussed above with reference to FIG. 3. In another embodiment, the trench mask layer 290 includes a dielectric material, for example silicon oxide, which can be patterned by a patterned photoresist layer. The formation of the trench mask layer 290 in effect creates a plurality of additional openings 210A-216A. A subset of the openings 210A-216A are disposed over (and aligned with) the openings 210-216, respectively. Alternatively, the subset of the openings 210A-216A may be viewed as extensions of the openings 210-216. The openings 210A-216A may also be referred to as trenches. In the illustrated embodiment, the openings 210A, 212A, and 216A are wider than the openings 211A, 213A-215A. The openings 210A-216A are reserved for the formation of metal line components in a later process, whereas the openings 210-216 are reserved for the formation of vias in the later process.

Figure 7:
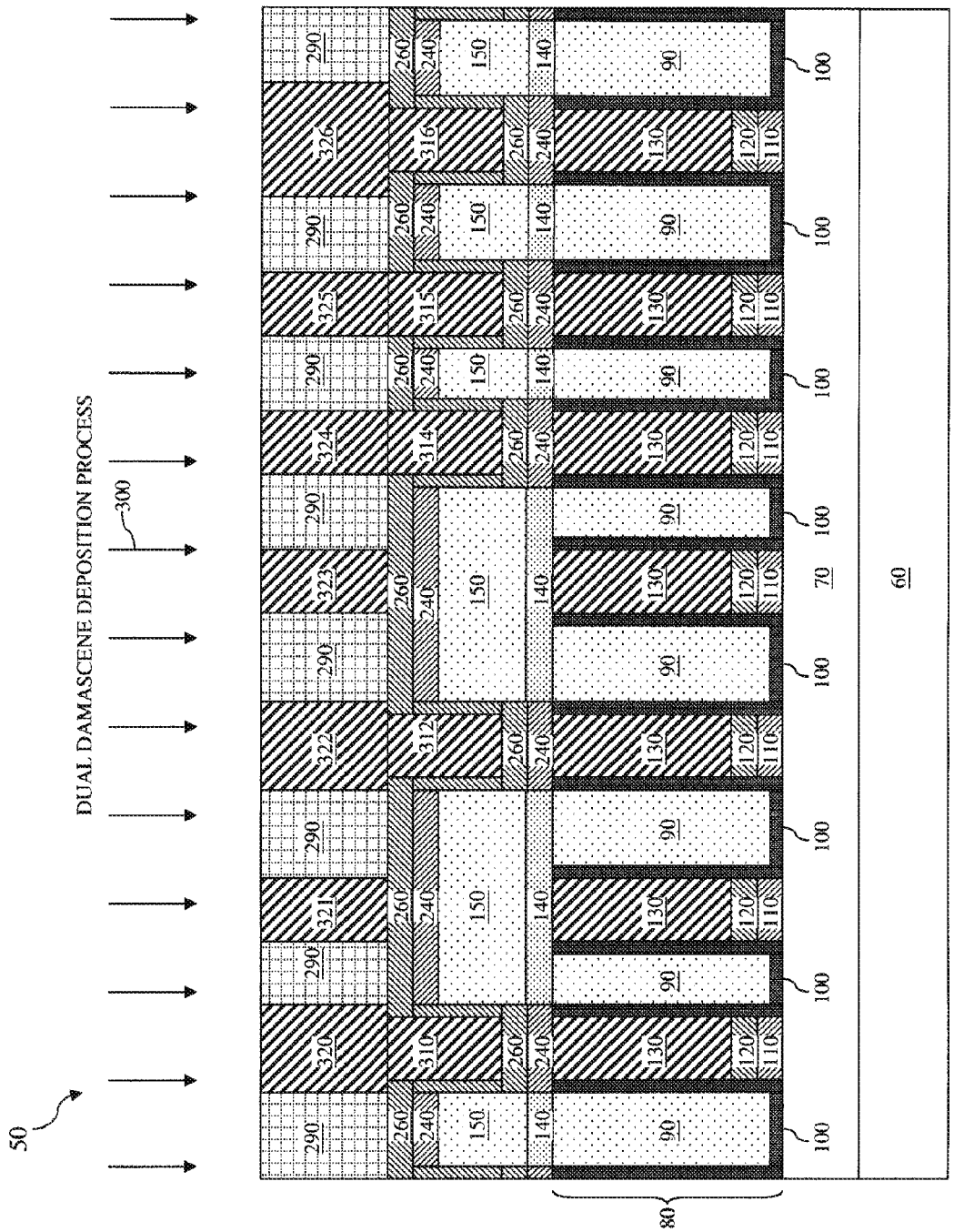

Referring now to FIG. 7, a dual damascene deposition process 300 is performed on the semiconductor device 50. The dual damascene deposition process 300 deposits a conductive material. In one embodiment, the conductive material is Cu. In one embodiment, the dual damascene process 300 includes an electro-less deposition (ELD) process. In another embodiment, the dual damascene deposition process 300 may include an electro plating process (ECP). A chemical mechanical polishing (CMP) process is subsequently performed after the dual damascene deposition process 300. As a result of the dual damascene process and the subsequent CMP process, a plurality of vias 310-316 are formed in the openings 210-216, and a plurality of metal lines 320-326 are formed in the openings 210A-216A. The vias 310-316 are formed on the conductive liner layer 260. The metal lines 320-326 are formed on the vias 310-316. In an embodiment, the via 314 and the metal line 324 formed thereon may be considered a single via. The same may be said for the vias 315 and the metal lines 325. The metal lines 320-326 and the trench mask layer 290 are disposed in an interdigitated or interleaving manner.

Traditional methods of forming vias in a dual damascene process involve using a physical vapor deposition (PVD) process to form a seed layer. Such seed layer formed by the PVD process may have poor conformity, meaning it may be thinner in some portions, while other portions may be substantially thicker. If the seed layer is too thin at a sidewall portion (for example less than about 50 Angstroms), then it may not adequately perform the seeding functions. On the other hand, if the seed layer is formed to be thick enough at a sidewall portion (for example greater than about 50 Angstroms), then it may have a top corner that are also too thick, causing overhangs that block the trench openings 210-216 (FIG. 5). The overhangs may prevent the subsequent via deposition and may lead to voids.

In comparison, the conductive liner layer 260 disclosed herein allows an electro-less deposition process to be used to form the vias 310-316. This may also be referred to as a direct plating process. Unlike conventional processes of forming vias, no seed layer is required for such process. The ALD or CVD processes used herein to form the conductive liner layer 260 can also be tuned to have good uniformity control. Consequently, the conductive liner 260 can be formed to be thin (less than 50 Angstroms) and conformal for both the bottom portions and the sidewall portions. This reduces the likelihood and the presence of overhangs, which allows the openings to be more easily filled by the vias 310-316 in the subsequent dual damascene deposition process 300. In addition, since the trench mask layer 290 is formed after the conductive liner layer 260 is formed, no portions of the conductive liner layer 260 are formed on the sidewalls of the trench mask layer 290. This also allows the trench openings to be wider compared to conventional methods, where a seed layer is formed on the sidewalk of a dielectric layer defining the shape of the metal lines above the vias. For these reasons discussed above, the trench filling performance is improved by the methods of the present disclosure.

Figure 8:
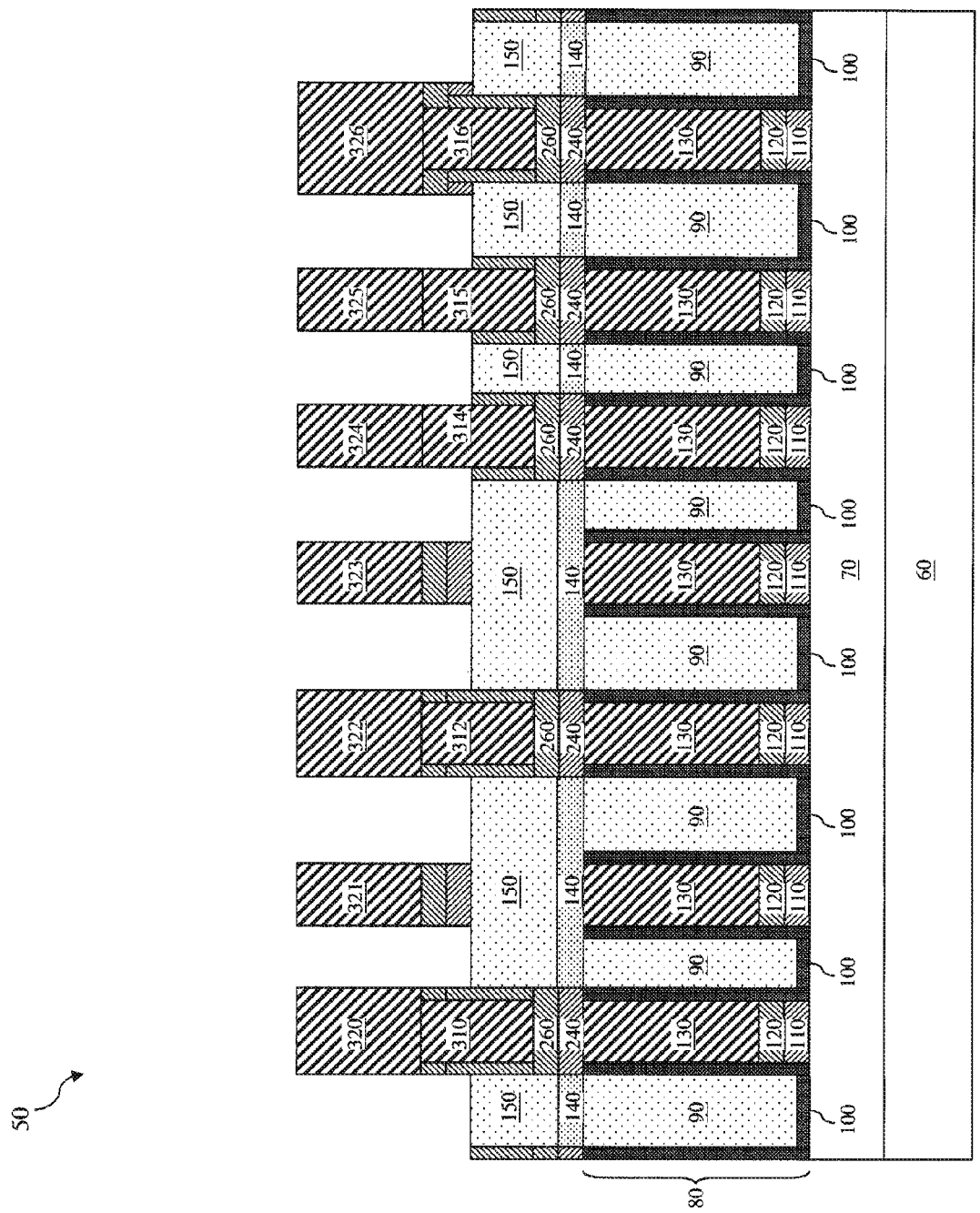

Referring now to FIG. 8, the trench mask layer 290 is removed. Thereafter, portions of the conductive barrier layer 240 and the conductive liner layer 260 not covered by the metal lines 320-326 are removed in a manner such that portions of the dielectric layer 150 are exposed.

Figure 9:
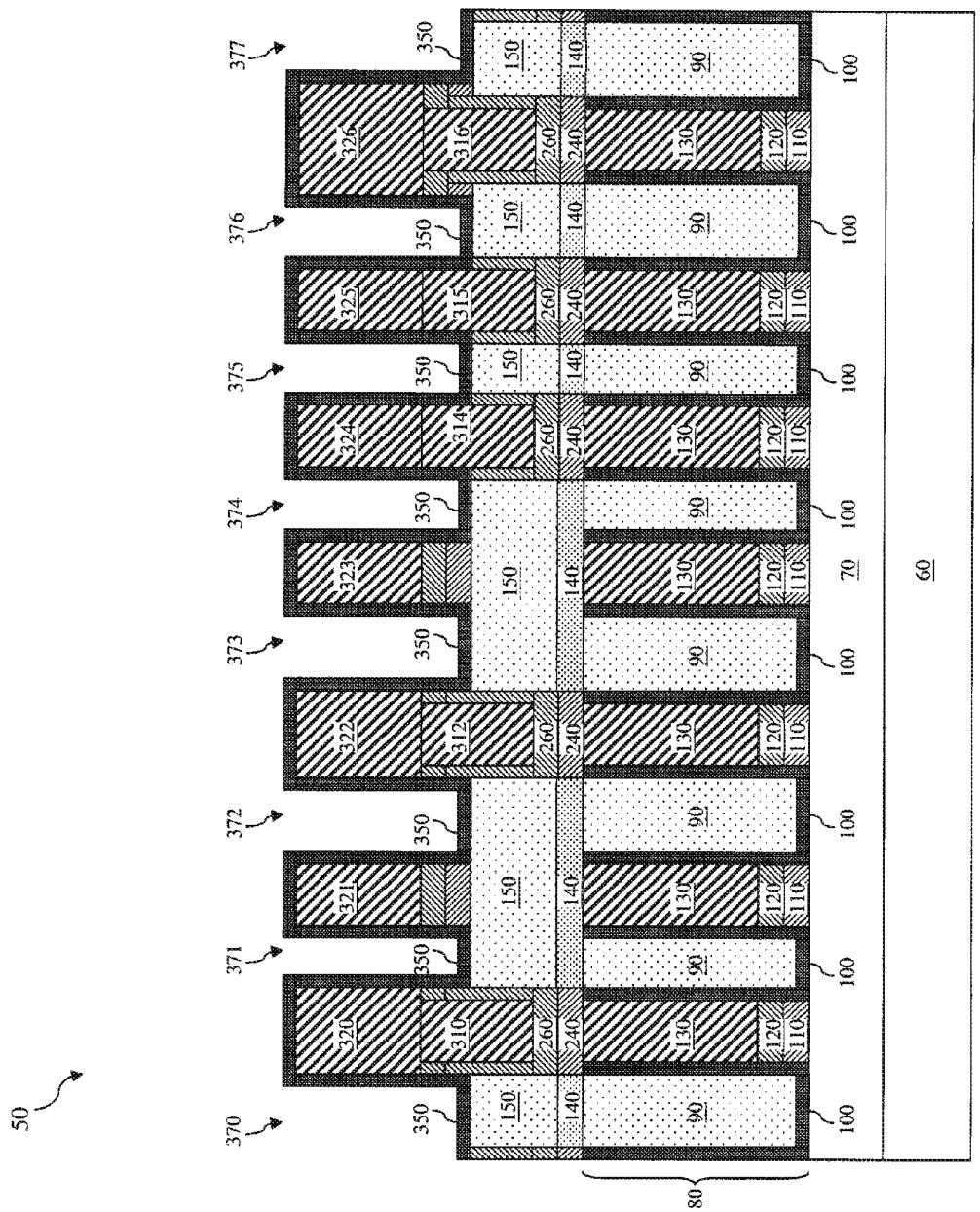

Referring now to FIG. 9, a dielectric barrier layer 350 is formed over the exposed portions of the dielectric layer 150 and on the top and sidewalls of the metal lines 320-326. The dielectric barrier layer 350 contains a material that is a compound made of a plurality elements selected from the group consisting of: Si, O, C, N, and B. The dielectric barrier layer 350 is shaped to form a plurality of openings 370-377. It may be said that the dielectric barrier layer 350 (and the openings 370-377) are formed in place of the removed trench mask layer 290 (FIG. 7).

Figure 10:
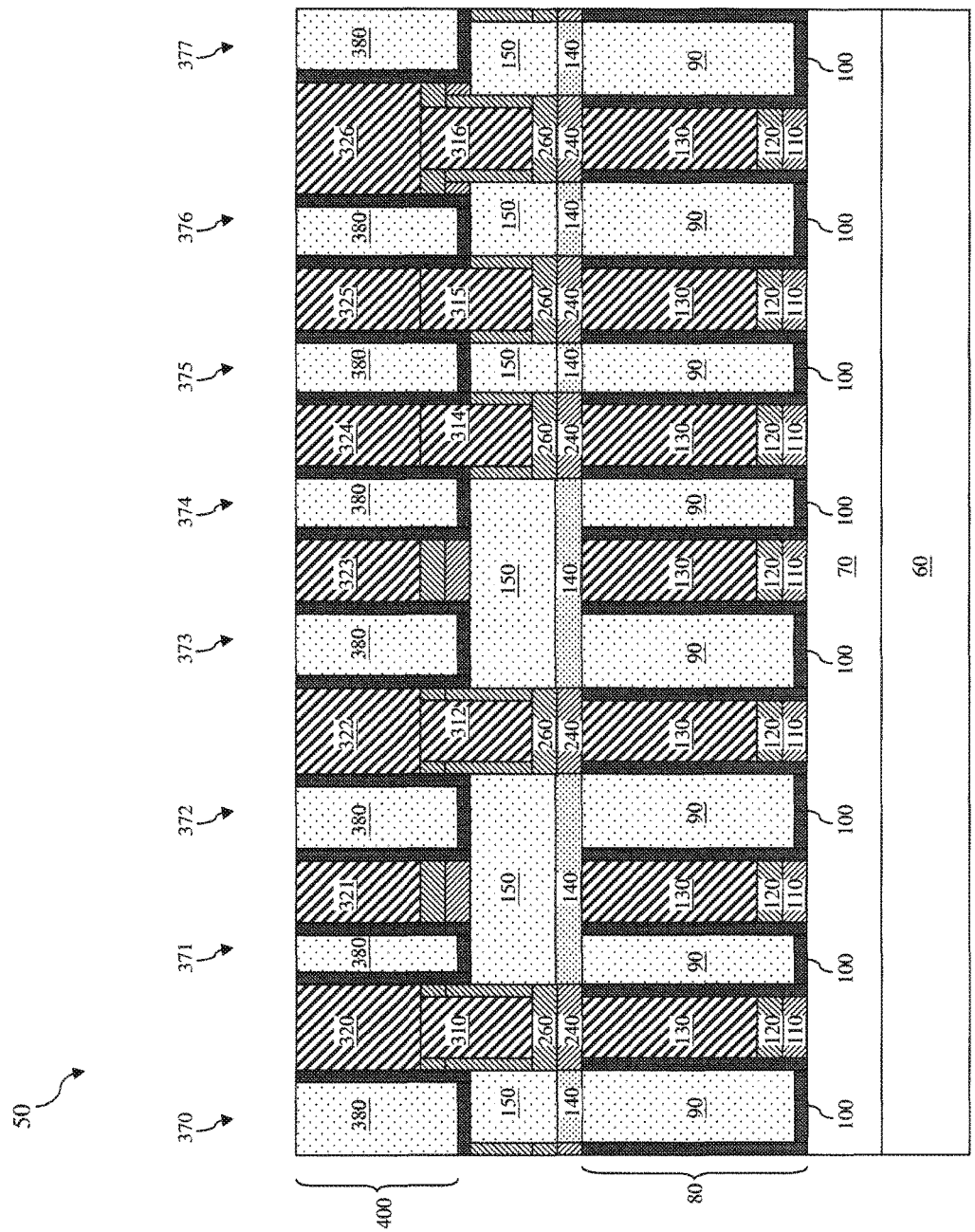

Referring now to FIG. 10, a dielectric layer 380 is formed over the dielectric barrier layer 350 and fills the openings 370-377. In an embodiment, the dielectric layer 380 includes a low-k material. A CMP process is then performed on the dielectric layer 380 until the upper surface of dielectric layer 380 is substantially co-planar with the metal lines 320-326. The dielectric layer 380 contains a plurality of segments that are at least partially surrounded or wrapped around by the dielectric barrier layer 350. The dielectric barrier layer 350 serves to reduce metal diffusion from adjacent metal structures such as the metal lines 320-326. This dielectric barrier layer 350 may be absent in metal layers formed by conventional dual damascene processes. At this point of fabrication, the metal lines 320-326 are disposed in an interdigitated or interleaving manner with segments of the dielectric layer 380 that fill the openings 370-377 of the dielectric barrier layer 350.

The processes discussed above in effect create an interconnect layer 400 that is includes the metal lines 320-326 and segments of the dielectric layer 380. The interconnect layer 400 is considered to be located above the interconnect layer 80. Thus, in an embodiment where the interconnect layer 80 is a Metal-1 layer, the interconnect layer 400 is a Metal-2 (M2) layer. The vias 310-316 electrically couple together the metal lines 320-326 in the interconnect layer 400 above and the metal lines 130 in the interconnect layer 80 below. In the illustrated embodiment, the vias 310-316 may be said to be disposed within a via-1 layer.

Although the fabrication processes of the interconnect layer 80 were not discussed in detail, it is understood that the processes used to form the interconnect layer 400 can be implemented in a similar manner to form the interconnect layer 80 as well. For example, according to one embodiment, the conductive barrier layer 110 is formed on the ILD layer 70. The conductive liner layer 120 is formed on the conductive barrier layer 110. A trench mask layer (similar to the trench mask layer 290) is formed on the conductive liner layer 120. The trench mask layer is then patterned to form a plurality of openings or trenches. The metal lines 130 are formed to fill these openings in a deposition process followed by a subsequent CMP process. The trench mask layer is then removed, and one or more etching processes are performed to remove portions of the conductive liner layer 120 and the conductive barrier layer 110 not protected by the metal lines 130. Thereafter, the dielectric barrier layer 100 is formed. The dielectric layer 90 is then formed to be surrounded by the dielectric barrier layer 100. It is also understood that the methods used to form the interconnect layer 80 and the interconnect layer 400 (and the via layer in between) may be applied to form additional interconnect layers and via layers above the interconnect layer 400, for example Metal-3 or Metal-4 layers.

The embodiments disclosed herein offer advantages over conventional dual damascene methods. It is understood, however, that different embodiments may offer other advantages, and that no particular advantage is required for all embodiments. One advantage is that the embodiments disclosed herein allow wider trenches to be formed by way of the formation of the "via-only" structure as discussed above, and by utilizing CVD or ALD to form a relatively conformal conductive liner layer. A thick copper seed layer is no longer required. As such, trench overhang issues may be substantially alleviated, and gap (trench) filling performance is improved. Another advantage is that the processes disclosed herein are compatible with existing semiconductor fabrication flow. Therefore, the embodiments of the present disclosure will not be expensive to implement.

One of the broader forms of the present disclosure involves a method of fabricating a semiconductor device, the method includes: forming a patterned dielectric layer having a plurality of first openings; forming a conductive liner layer over the patterned dielectric layer, the conductive liner layer partially filling the first openings; forming a patterned trench mask layer over portions of the conductive liner layer outside the first openings, thereby forming a plurality of second openings, wherein at least a subset of the second openings are disposed over the first openings; depositing a conductive material in the first openings to form a plurality of vias and in the second openings to form a plurality of metal lines; and removing the trench mask layer.

In an embodiment, the method includes: after the removing the trench mask layer, removing portions of the conductive liner layer not covered by the metal lines; forming a dielectric barrier layer over portions of the patterned dielectric layer and on sidewalls of the metal lines, thereby forming a plurality of third openings; filling the third openings with a low-k dielectric material; and performing a chemical-mechanical-polishing process on the low-k material.

In an embodiment, the forming the conductive liner layer includes one of: an atomic layer deposition process and a chemical vapor deposition process.

In an embodiment, the depositing includes depositing copper as the conductive material in an electro-less deposition process.

In an embodiment, the method further includes: before the forming the patterned dielectric layer: forming an interconnect layer over a substrate, the interconnect layer containing a plurality of further metal lines; and forming an etching-stop layer over the interconnect layer; wherein: the forming the patterned dielectric layer includes forming the patterned dielectric layer on the etching-stop layer; and the patterned dielectric layer contains a low-k dielectric material.

In an embodiment, the method includes: before the forming the conductive liner layer, forming a conductive barrier layer over the patterned dielectric layer; and wherein the conductive liner layer is formed on the conductive barrier layer.

In an embodiment, the conductive liner layer includes a non-copper metal material; and the conductive barrier layer includes a material selected from the group consisting of: tantalum, tantalum nitride, titanium, titanium nitride, and manganese oxide.

In an embodiment, the conductive barrier layer and the conductive liner layer are each thinner than about 50 Angstroms.

Another one of the broader forms of the present disclosure involves a method of fabricating a semiconductor device, the method includes: forming an interconnect layer over a substrate, the interconnect layer containing a plurality of first metal line components; forming an etching-stop layer over the interconnect layer; forming a first low-k dielectric layer over the interconnect layer, the first low-k dielectric layer containing a plurality of first openings; forming a conductive barrier layer over the first low-k dielectric layer; forming a conductive liner layer over the conductive barrier layer, the conductive barrier layer and the conductive liner layer partially filling the first openings, wherein the forming the conductive liner layer is carried out using one of: a chemical vapor deposition process and an atomic layer deposition process; forming a trench mask layer over the conductive liner layer and over the first openings, the trench mask layer containing a plurality of second openings, wherein at least a subset of the second openings are aligned with the first openings therebelow; forming a plurality of vias in the first openings and a plurality of second metal line components in the second openings; thereafter removing the trench mask layer; thereafter forming a dielectric barrier layer in place of the removed trench mask layer, the dielectric barrier layer containing a plurality of third openings; and filling the third openings with a second low-k dielectric layer.

In an embodiment, the forming the trench mask layer is carried out in a manner such that at least some of the second openings are wider than the respective first openings disposed therebelow.

In an embodiment, the forming the plurality of vias and the plurality of second metal line components is carried out by depositing a copper material in an electro-less plating process.

In an embodiment, the conductive liner layer includes a metal material that is free of copper; and the conductive barrier layer includes a material selected from the group consisting of: tantalum, tantalum nitride, titanium, titanium nitride, and manganese oxide.

In an embodiment, the conductive harrier layer and the conductive liner layer are each no thicker than about 50 Angstroms.

Yet another one of the broader forms of the present disclosure involves a semiconductor device. The semiconductor device includes: a layer containing a plurality of conductive barrier segments interdigitated with a plurality of etching-stop segments; a plurality of first dielectric segments disposed over the etching-stop segments, respectively; a plurality of conductive liner segments disposed over the conductive barrier segments, respectively, wherein portions of the conductive liner segments are disposed on sidewalls of the first dielectric segments; a plurality of dielectric barrier segments disposed over the first dielectric segments, respectively, wherein the dielectric barrier segments contain a plurality of openings; a plurality of second dielectric segments filling the openings, respectively; a plurality of vias disposed over the conductive liner segments, respectively; and a plurality of metal line components, wherein a first subset of the metal line components are each disposed over a respective one of the vias, and a second subset of the metal line components are disposed over a respective one of the first dielectric segments.

In an embodiment, the metal line components are interdigitated with the second dielectric segments.

In an embodiment, the conductive liner segments each include a metal material that is free of copper; and the conductive barrier segments each include a material selected from the group consisting of: tantalum, tantalum nitride, titanium, titanium nitride, and manganese oxide.

In an embodiment, each conductive barrier segment and each conductive liner segment are no thicker than about 50 Angstroms.

In an embodiment, the semiconductor device of claim further includes: a substrate; an interlayer dielectric (ILD) layer disposed over the substrate; and an interconnect layer disposed over the ILD layer, the interconnect layer containing a plurality of further metal line components; wherein the layer containing the conductive barrier segments is disposed over the interconnect layer.

In an embodiment, the interconnect layer further includes: a plurality of further conductive barrier segments disposed over the ILD layer; a plurality of further conductive liner segments disposed over the conductive barrier segments, respectively; a plurality of further dielectric barrier segments disposed over the ILD layer, the further dielectric barrier segments containing a plurality of further openings; and a plurality of third dielectric segments filling the further openings, respectively; wherein: the further metal line components are disposed over the further conductive liner segments, respectively; and the further metal line components are interdigitated with the third dielectric segments.

In an embodiment, the first, second, and third dielectric segments all contain a low-k dielectric material; and the dielectric barrier segments all contain a material that is a compound, the compound being made of a plurality of elements selected from the group consisting of: silicon, oxygen, carbon, nitride, and boron.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
an interconnect layer disposed over a substrate, wherein:
the interconnect layer includes a plurality of dielectric segments and a plurality of metal components, the plurality of metal components including a first group of the metal components and a second group of the metal components, wherein distances between the substrate and bottom surfaces of the second group of the metal components are different from distances between the substrate and bottom surfaces of the dielectric segments, and wherein distances between the substrate and top surfaces of the second group of the metal components are substantially the same as distances between the substrate and top surfaces of the dielectric segments;
a plurality of vias disposed below, and electrically coupled to, the first group of the metal components;
a plurality of dielectric components disposed underneath the second group of the metal components;
a conductive liner disposed underneath the vias and between the vias and the dielectric components, but not on sidewalls of the metal components; and
a plurality of dielectric barrier layers disposed between the metal components and the dielectric segments, wherein the dielectric barrier layers are separate from one another and have different material compositions from the dielectric segments.

2. The semiconductor device of claim 1, wherein the dielectric barrier layers contain a material that is a compound made of a plurality elements selected from the group consisting of: Si, O, C, N, and B.

3. The semiconductor device of claim 1, wherein the dielectric segments each contain a low-k material.

4. The semiconductor device of claim 1, wherein the dielectric barrier layers are further disposed below the dielectric segments.

5. The semiconductor device of claim 1, wherein the dielectric segments are interleaved with the metal components.

6. The semiconductor device of claim 1, wherein the dielectric components are interleaved with the vias.

7. The semiconductor device of claim 1, wherein the conductive liner is further disposed on sidewalls of the vias.

8. The semiconductor device of claim 1, further comprising: a conductive barrier layer disposed below each of the metal components in the second group.

9. The semiconductor device of claim 8, wherein the conductive barrier layer contains: tantalum (Ta), tantalum nitride ($TaN_x$), titanium (Ti), titanium nitride ($TiN_x$), or manganese oxide ($MnO_x$).

10. The semiconductor device of claim 1, wherein the interconnect layer is a first interconnect layer, the dielectric segments are first dielectric segments, and the metal components are first metal components, and wherein the semiconductor device further comprises a second interconnect layer disposed between the first interconnect layer and the substrate, and wherein the second interconnect layer includes a plurality of second dielectric segments and a plurality of second metal components.

11. The semiconductor device of claim 10, wherein:
the second dielectric segments are disposed below and vertically approximately aligned with the first dielectric segments; and the second metal components are disposed below and vertically approximately aligned with the first metal components.

12. The semiconductor device of claim 10, further comprising an etching-stop layer disposed between the first interconnect layer and the second interconnect layer.

13. The semiconductor device of claim 10, further comprising a dielectric barrier layer disposed between the second metal components and the second dielectric segments, wherein the dielectric barrier layer and the second dielectric segments have different material compositions.

14. A semiconductor device, comprising:
an interconnect layer disposed over a substrate, wherein: the interconnect layer includes a plurality of dielectric segments interleaved with a plurality of metal components;
a plurality of vias disposed below, and electrically coupled to, a first group of the metal components;
a plurality of dielectric components disposed underneath a second group of the metal components, the dielectric components interleaving with the vias;
a conductive barrier layer disposed between the dielectric components and the second group of the metal components;
a conductive liner disposed underneath and on sidewalls of the vias, wherein the conductive liner and the conductive barrier layer have different material compositions; and
a plurality of dielectric barrier layers each disposed between the metal components and the dielectric segments, wherein each of the dielectric barrier layers has a first material composition, and the dielectric segments have a second material composition different from the first material composition, wherein the dielectric barrier layers are discontinuous with one another.

15. The semiconductor device of claim 14, wherein:
each of the dielectric barrier layers contains a material that is a compound made of a plurality elements selected from the group consisting of: Si, O, C, N, and B; and
the dielectric segments contain a low-k material.

16. The semiconductor device of claim 14, wherein:
the dielectric barrier layers are further disposed below the dielectric segments; and
the conductive liner is further disposed on sidewalls of the vias.

17. The semiconductor device of claim 14, further comprising: a conductive barrier layer disposed below each of the metal components in the second group, and wherein the conductive barrier layer contains: tantalum (Ta), tantalum nitride ($TaN_x$), titanium (Ti), titanium nitride ($TiN_x$), or manganese oxide ($MnO_x$).

18. A semiconductor device, comprising:
an interconnect layer disposed over a substrate, wherein: the interconnect layer includes a plurality of dielectric segments interleaved with a plurality of metal components;
a plurality of vias disposed below, and electrically coupled to, a first group of the metal components;
a plurality of dielectric components disposed underneath a second group of the metal components, the dielectric components interleaving with the vias;
a plurality of etching-stop layer segments disposed below the plurality of dielectric components, wherein upper surfaces of the etching-stop layer segments are disposed below bottom surfaces of the dielectric components;
a conductive liner disposed below a bottom surface and on sidewalls of the vias; and
a dielectric barrier layer having a first material composition disposed below a bottom surface and on sidewalls of the dielectric segments, wherein the dielectric segments have different material compositions than the first material composition.

19. The semiconductor device of claim 18, further comprising: a conductive barrier layer disposed below each of the metal components in the second group.

20. The semiconductor device of claim 1, wherein each of the dielectric segments is disposed on a respective one of the dielectric barrier layers.

* * * * *